United States Patent [19]

Welch et al.

[11] 4,058,413

[45] Nov. 15, 1977

[54] ION IMPLANTATION METHOD FOR THE FABRICATION OF GALLIUM ARSENIDE SEMICONDUCTOR DEVICES UTILIZING AN ALUMINUM NITRIDE PROTECTIVE CAPPING LAYER

[75] Inventors: Bryant M. Welch, Thousand Oaks; Richard D. Pashley, San Jose, both of Calif.

[73] Assignee: The United States of America as represented by the Secretary of the Air Force, Washington, D.C.

[21] Appl. No.: 685,841

[22] Filed: May 13, 1976

[51] Int. Cl.² .................. H01L 21/265; H01L 21/324
[52] U.S. Cl. .................................. 148/1.5; 148/187; 357/91
[58] Field of Search ............... 148/1.5, 175, 187; 357/91

[56] References Cited

U.S. PATENT DOCUMENTS

| 3,352,725 | 11/1967 | Antell | 148/187 X |
| 3,462,323 | 8/1969 | Groves | 148/175 |
| 3,600,218 | 8/1971 | Pennebaker | 148/187 X |
| 3,649,369 | 3/1972 | Hunsperger et al. | 148/1.5 |
| 3,717,790 | 2/1973 | Dalton et al. | 148/1.5 |
| 3,880,676 | 4/1975 | Douglas et al. | 148/1.5 |
| 3,984,263 | 10/1976 | Asao et al. | 148/1.5 X |

OTHER PUBLICATIONS

Cuomo et al., "Mask Substrate Surface Shield" I.B.M. Tech. Discl. Bull., vol. 15, No. 6, Nov. 1972, pp. 1728-1729.

Primary Examiner—L. Dewayne Rutledge
Assistant Examiner—W. G. Saba
Attorney, Agent, or Firm—Joseph E. Rusz; William J. O'Brien

[57] ABSTRACT

A method for forming tellurium N-type layers in gallium arsenide by using ion implantation as the doping process and aluminum nitride as a protective overcoat to prevent disassociation of the gallium arsenide during anneal.

1 Claim, 4 Drawing Figures

ION IMPLANTATION METHOD FOR THE FABRICATION OF GALLIUM ARSENIDE SEMICONDUCTOR DEVICES UTILIZING AN ALUMINUM NITRIDE PROTECTIVE CAPPING LAYER

STATEMENT OF GOVERNMENT INTEREST

The invention described herein may be manufactured and used by or for the Government for governmental purposes without the payment of any royalty thereon.

BACKGROUND OF THE INVENTION

This invention relates to gallium arsenide semiconductor devices and to a method for their fabrication. More particularly, this invention concerns itself with the fabrication of tellurium implanted submicron N-type layers in gallium arsenide semiconductors and to the use of aluminum nitride as an encapsulating medium during the high temperature annealing step used in the fabrication process.

In recent times, gallium arsenide has become a basic semiconductor material for the production of microwave devices. It exhibits excellent semiconductor properties, particularly at higher temperatures and at both higher and lower frequencies than are usable with germanium or silicon. This is attested to by its increased use in the fabrication of rectifiers, transistors, photoconductors, light sources, light emitters, and maser and laser diodes. The majority of these microwave devices are constructed by epitaxial doping techniques since an N-type diffusion technology in gallium arsenide has not been established. However, even though epitaxial methods are successful, it has been difficult to produce uniform dopant layers less than a few tenths of a micron in thickness.

In an attempt to overcome this problem, it has been found that ion implantation is an effective and efficient process for doping gallium arsenide. It provides accurate control for the doping process and lends itself well to mass production.

In addition to the doping of active regions, ion implantation can be utilized to reduce GaAs contact resistance. For most devices it is essential to have the lowest resistance Ohmic contact possible. The generation of excessive Ohmic heating limits the output power of such devices as laser diodes, impatt diodes and Gunn oscillators.

Some early attempts at the N-type doping of GaAs suggested the use of room temperature implantation and an $SiO_2$ anneal overcoat. However, room temperature implantation in GaAs was found to lead to lower electrical activity than hot substrate implantation. In addition, gallium readily diffuses through $SiO_2$, and in the case of tellurium implantation, this loss of gallium has been found to result in Ga vacancy-Te complexes after anneal.

In considering the ancillary problem posed through the use of a $SiO_2$ overcoat, it was suggested that $Si_3N_4$ be used since it provides an excellent mask against gallium or arsenic diffusion.

Unfortunately, the ion implantation of N-type layers in GaAs has not been a consistently reproducible process. Electrical activities over a wide range have been observed for identical implant conditions and substrates. This has been attributed largely to the often poor adherence of sputtered $Si_3N_4$ during the annealing process. This problem of adherence may be related to the facts that it is difficult to sputter oxygen-free $Si_3N_4$ and the thermal mismatch between $Si_3N_4$ and GaAs is large. Also, the composition and strain characteristics of sputtered $Si_3N_4$ may be quite different than $Si_3N_4$ deposited by other techniques.

In an effort to obtain more uniform results, considerable research was conducted on the effect of changing the anneal overcoat. The objective was to find a dielectric layer with improved adherence and masking qualities that would result in consistently high electrical activity. Sputtered AlN was found to be the most effective anneal overcoat for this work since it has an expansion coefficient of $6.1 \times 10^{-6}/°$ C which closely matches the GaAs value. In addition, any oxygen incorporated in the AlN film would be in the form of $Al_2O_3$, not $SiO_2$ as in the case of $Si_3N_4$. The process provides an effective method for producing tellurium implanted N-type layers in gallium arsenide.

SUMMARY OF THE INVENTION

In accordance with the method of this invention, the formation of submicron N-type layers of tellurium in gallium arsenide can be effectively accomplished through the use of an ion implantation technique. The implantation was performed with gallium arsenide substrates held at 350° C. After implantation, a protective overcoat of AlN was sputtered on the samples to prevent the GaAs from disassociating during anneal (900° C). The electrical characteristics of the N-type implants were then measured. Current-voltage and capacitance-voltage characteristics of implanted diodes indicated that the junctions were linearly graded and that there was no intrinsic layer present after anneal. Sheet resistivity and Hall effect measurements were used to determine the surface carrier concentration and effective mobility in the implanted layers. Ionized impurity profiles extending beyond the implanted junction depth were calculated by matching differential Hall effect date with junction capacitance-voltage data. A peak electron concentration of $7 \times 10^{18}$ electrons/cm$^3$ was observed.

Accordingly, the primary object of this invention is to provide a novel technique for the formation of submicron N-type layers in a gallium arsenide substrate.

Another object of this invention is to provide a protective technique for preventing the disassociation of a gallium arsenide substrate during anneal at elevated temperatures.

Still another object of this invention is to provide a technique for the ion implantation of a tellurium dopant into a gallium arsenide substrate.

A further object of this invention is to provide a technique for utilizing aluminium nitride as a protective overcoat during the anneal of a tellurium doped gallium arsenide substrate in order to prevent the diffusion of gallium and arsenic through the protective overcoats previously used in the art.

The above and still further objects and advantages of this invention will be better understood by referring to the following detailed description thereor when taken in conjunction with the accompanying drawing.

DESCRIPTION OF THE PREFERRED EMBODIMENT

In the present invention, samples were prepared in a conventional manner from Cd doped P-type GaAs with a measured carrier concentration of $2.3 \times 10^{17}$ holes/cm$^3$ and a mobility of 196 cm$^2$/v-sec. Implantations of 220 keV tellurium were performed at 350° C into the GaAs substrates with the incident beam at least 10° from any low-index axis. Ion doses ranged from $3 \times 10^{13}$ to $3 \times 10^{14}$ Te/cm$^2$. For the lower dose samples, an additional implant was made at 60 keV with a dose one-third the 220 keV dose.

After implantation, AlN or $Si_3N_4$ was sputtered on the samples, to compare the properties of the two anneal overcoats. The samples were then annealed at 900° C for 10 minutes in flowing hydrogen. Photoresist lifting techniques were employed to make ohmic contacts to the implanted layers. A 400 A layer of Au-Ge), (12 weight percent Ge), followed by a 500A layer of Ni was evaporated on the resist-coated implants. Thin films of Au-Ge were chosen to avoid shorting the implanted junction as Au-Ge is known to penetrate deeply into GaAs during alloying. The contacts were alloyed at 450° C for 2 minutes in a hydrogen atmosphere. Mesa etching was used to define the Hall patterns and various diode structures.

Backscattering measurements on AlN layers were performed using a 3 MV accelerator. The specimens were exposed to 2 MeV He+ions and the energy spectrum of the backscattered ions was recorded. Standard backscattering analysis techniques were applied to the spectra in order to determine the composition of the AlN layers.

To determine the carrier concentration and mobility profiles in the implanted samples, sheet resistivity and Hall effect measurements were performed as a function of layer removal. Thin layers were stripped from the implanted surface by etching the sample in a solution of equal parts $H_2SO_4$ and $H_2O_2$ to 100 parts $H_2O$. During the etch, the contact pads and channels to the Hall pattern were protected by black wax. The thickness of the removed layers was calculated by performing interferometry measurements on the GaAs step after the final strip had been completed.

Capacitance-voltage and current-voltage measurements were made in the dark on small area diodes ($1.67 \times 10^{-4}$ cm$^2$). By analyzing the junction C-V data, it was possible to extend the carrier concentration profile to beyond the junction depth. Scanning electron microscopy was used to determine the junction depth.

Figure 1:
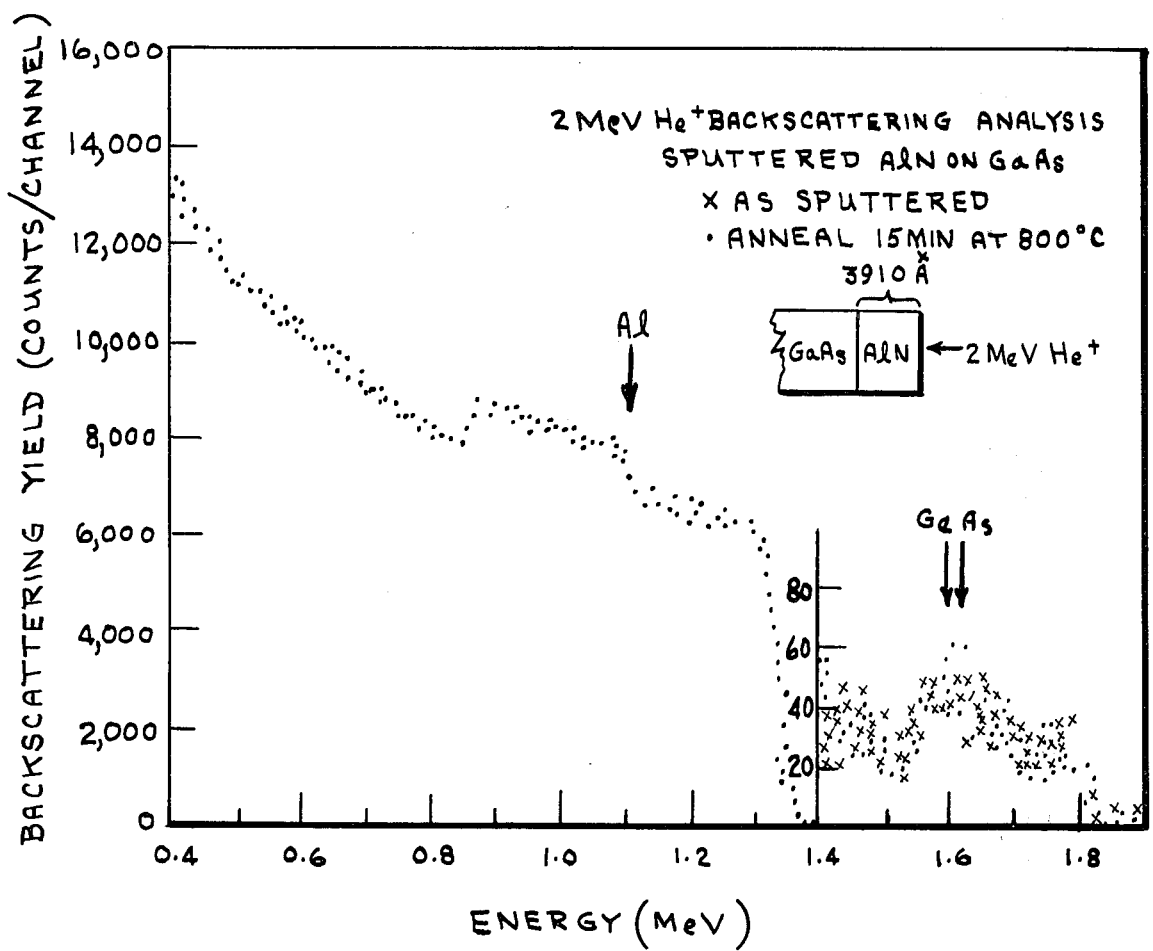
FIG. 1 represents a graphical illustration of the energy spectrum of 2 MeV He ions backscattered from an AlN coated GaAs sample.

In the past, there have been problems with gallium or arsenic out-diffusing through the dielectric overcoat during anneal. FIG. 1 compares backscattering spectra taken before and after anneal of an AlN coated GaAs sample. The counts beyond 1.4 MeV indicate there are trace impurities in the AlN film. However, since there is no change in the spectrum after anneal, it can be concluded that there was no pronounced gallium or arsenic out-diffusion during the anneal. If either gallium or arsenic were present in the film, they were in concentrations of less than 2%.

Scanning electron microscopy verified that the AlN adhered to GaAs during anneal. The surface of an AlN overcoated GaAs sample was smooth and featureless after annealing at 850° C for 15 minutes.

The current-voltage characteristics of several implanted diodes were measured in the range of $10^{-11}$ to $10^{-2}$ amps. The forward characteristic of an ideal GaAs diode generally follows the relation $1 = 1_o \exp(qV/nkT)$ where $n=2$. Only in one case as shown in Table I, was such an ideal behavior observed. Most of the implanted diodes had a forward characteristic $n$ value equal to 1.15. This low value of $n$ is interpreted to be the result of surface recombination since in all cases the forward current scaled as a function of junction area. The reverse characteristics were of varied quality. Some had better reverse characteristics than previously known diffused structures of similar substrate doping. Others, however, had high leakage currents and low breakdown voltages. Since the leakage was mostly junction area dependent, the deep penetration of the Au-Ge contacts may have been the cause of these poor characteristics.

Examination of the cleaved edge of one of the ion implanted diodes using a scanning electron microscope showed fingers of alloyed Au-Ge penetrating to depths of 1200A ± 200A deep in the GaAs. If the junction region were not heavily doped, a low voltage breakdown would occur as the depletion layer approached the alloyed Au-Ge.

Figure 2:
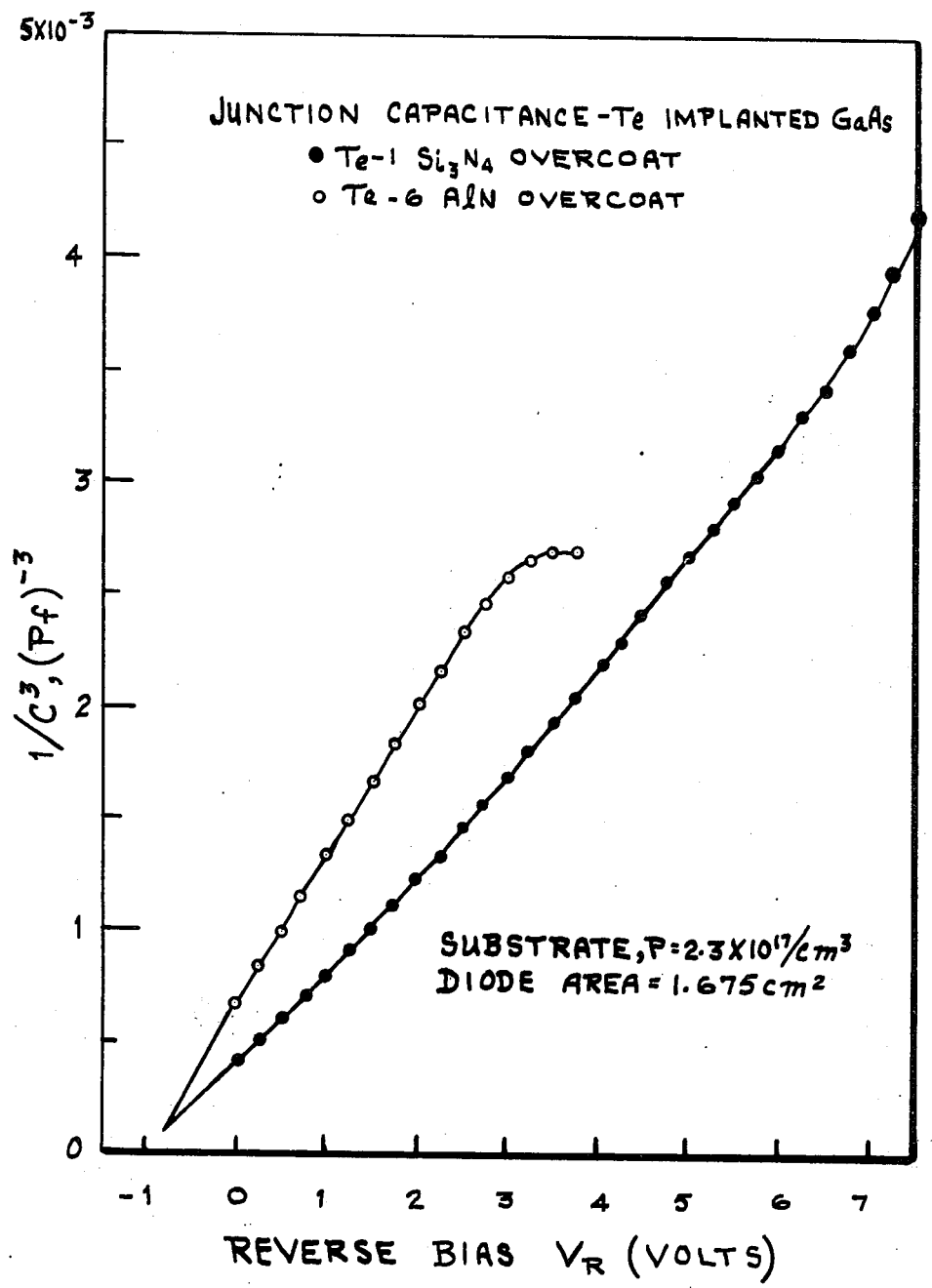
FIG. 2 represents a graphical illustration showing the capacitance-voltage characteristics of two ion implanted diodes.

Capacitance-voltage measurements indicated that all the junctions were linearly graded with no evidence of intrinsic layers. The C-V characteristics of two implanted diodes are presented in FIG. 2. The diodes were prepared identically except one was overcoated with AlN before anneal and the other $Si_3N_4$. In both cases the $1/C^3$ vs. V curves are linear, which is characteristic of linear graded junctions. Slope calculations yield a grading of $2.5 \times 10^{22}$/cm$^4$ for the AlN sample (Te-6) and $4.5 \times 10^{22}$/cm$^4$ for the $Si_3N_4$ specimen (Te-1). The results for other samples are summarized in Table I. It is interesting to note that there is no large discrepancy in the grading values between the AlN overcoated samples and the $Si_3N_4$ covered samples.

The surface carrier concentration, sheet resistivity, and effective mobility in the implanted layers are listed in Table I. The electrical activity ranges from a few percent up to 45%, with the AlN overcoated samples generally having higher activities than the $Si_3N_4$ coated samples. In addition, the AlN overcoated samples have $N_s$ values that increase with increasing dose, while the $Si_3N_4$ values show some scatter.

Figure 3:
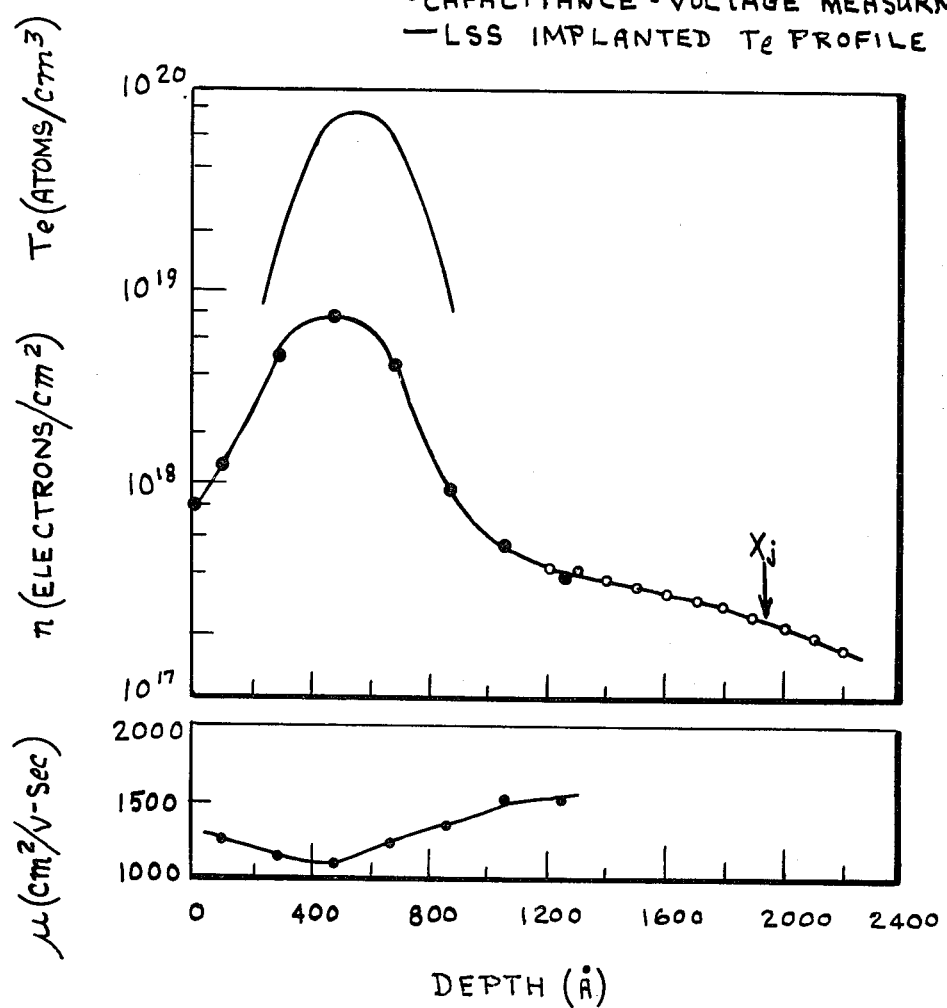
FIG. 3 is a graphical illustration showing the electron concentration and mobility profiles for a tellurium implanted sample processed with a $Si_3N_4$ coating during anneal.

The carrier concentration and mobility profiles for an implanted sample overcoated with $Si_3N_4$ are shown in FIG. 3. Sequential Hall measurements in conjunction with layer removal were used to determine the carrier profile to a depth within a 1000A of the implanted junction. Slope analysis of the capacitance-voltage data (FIG. 2) produced a carrier concentration profile referenced to the junction depth and the substrate doping level. By using the SEM value of 2200A as the junction depth and a substrate doping of $2.3 \times 10^{17}$ holes/cm$^3$, the C-V data were coupled with the differential Hall effect data to generate a carrier concentration profile extending from the surface to the junction depth. A consistent match of C-V carrier profile (open circles) to the Hall effect carrier profile (closed circles) is seen.

Figure 4:
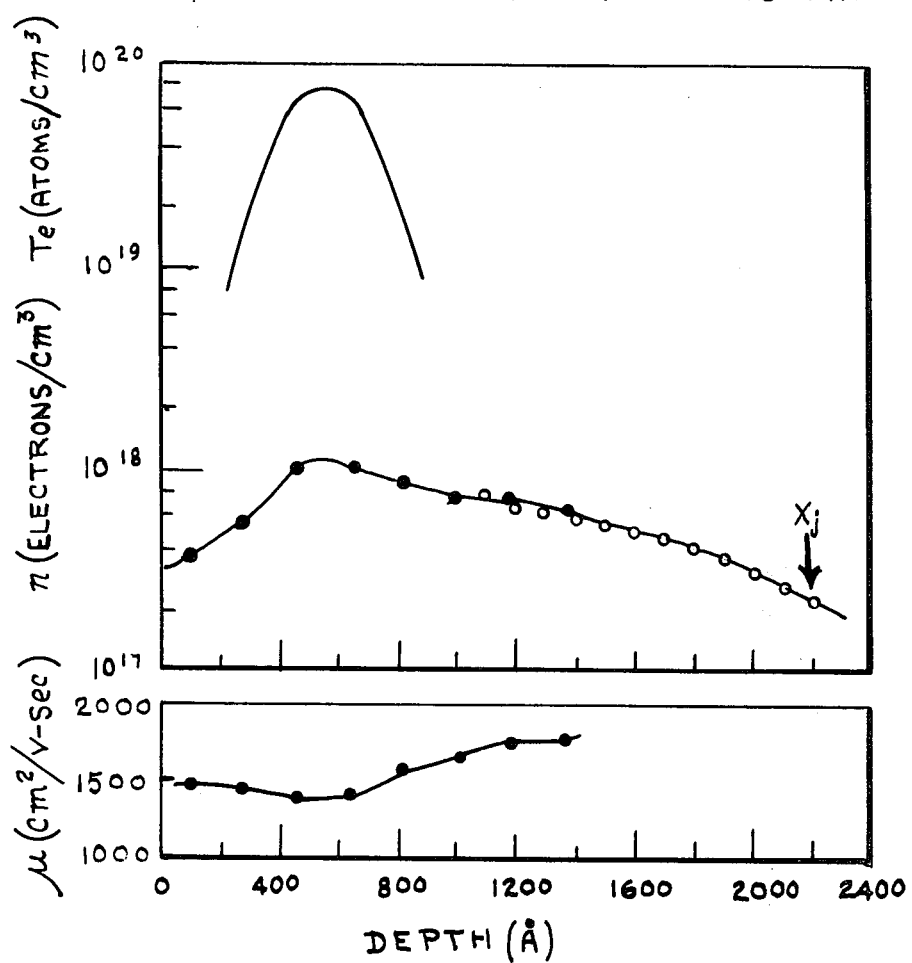
FIG. 4 is a graphical illustration showing electron concentration and mobility profiles for a tellurium implanted sample processed with an AlN coating during anneal.

FIG. 4 presents the profile of an identical implant as shown in FIG. 3 except for processing with an AlN overcoat. In this case, this Hall effect profile and C-V profile were matched by slope without the aid of a junction depth measurement. The carrier profile exhibits a significantly higher peak election concentration than that of the previous sample. The peak value of $7 \times 10^{18}$ electrons/cm$^3$ is about equal to the maximum electron concentration which has been attained by doping GaAs with tellurium during growth. In addition, the deeply penetrating component of the carrier concentration is not as pronounced as that of the $Si_3N_4$ overcoated sample.

TABLE I

Summary of the Electrical Properties of Tellurium Implanted GaAs

| Sample No. | Implant Dose (cm$^{-2}$) | Anneal Overcoat | Surface Carrier Concentration (cm$^{-2}$) | Effective Mobility (cm$^2$/V-sec) | Junction Grading (cm$^{-4}$) | Forward -V Slope(b) (n) |
|---|---|---|---|---|---|---|
| Te-4 | $3 \times 10^{13}$(a) | $Si_3N_4$ | $6.6 \times 10^{12}$ | 1984 | $2.3 \times 10^{22}$ | 1.16 |
| Te-2 | $1 \times 10^{14}$(a) | $Si_3N_4$ | $7.2 \times 10^{12}$ | 1389 | — | — |
| G-74 | $1 \times 10^{14}$ | $Si_3N_4$ | $2.0 \times 10^{13}$ | 1498 | $3.1 \times 10$ | 1.15 |
| G-80 | $1 \times 10^{14}$ | $Si_3N_4$ | $1.3 \times 10^{13}$ | 1350 | — | — |
| Te-1 | $3 \times 10^{14}$ | $Si_3N_4$ | $1.2 \times 10^{13}$ | 1538 | $4.5 \times 10^{22}$ | 2.0 |
| Te-3 | $3 \times 10^{13}$(a) | AlN | $1.8 \times 10^{13}$ | 1664 | $2.7 \times 10^{22}$ | 1.18 |
| Te-5 | $1 \times 10^{14}$(a) | AlN | $3.1 \times 10^{13}$ | 1371 | $2.9 \times 10^{22}$ | 1.21 |
| Te-19 | $1 \times 10^{14}$(a) | AlN | $2.6 \times 10^{13}$ | 1158 | — | — |
| Te-6 | $3 \times 10^{14}$ | AlN | $4.0 \times 10^{13}$ | 1166 | $2.5 \times 10^{22}$ | 1.16 |

(a)For these samples, an additional implant was made at 60 keV with a dose one-third of the 220 keV dose given.
(b)$1 = 1_o exp(qV/nkT)$.

The comparison between sputtered AlN and $Si_3N_4$ as an annealing overcoat or cap on implanted GaAs shows that the method of this invention provides an effective and efficient means for forming submicron layers of tellurium in a gallium arsenide substrate. The maximum electrical activity achieved using a sputtered AlN overcoat is comparable to the maximum value previously attained using a sputtered $Si_3N_4$ overcoat. However, AlN has adherence properties that make it preferable to $Si_3N_4$. Also, the masking qualities of AlN are less sensitive to oxygen incorporated in the dielectric layer than $Si_3N_4$. Such integrity is essential for device fabrication.

In summary, the implantation of tellurium has been shown to create submicron n-type layers in GaAs with electron concentrations approximately equal to the maximum attainable in tellurium doped GaAs ($\sim 10^{19}$ electrons/cm$^3$) implanted junctions were linearly graded with no evidence of an intrinsic region.

Although the invention has been described with reference to a particular embodiment, it will be understood to those skilled in the art that the invention is capable of a variety of alternative embodiments within the spirit and scope of the appended claims.

What is claimed is:

1. A process for fabricating semiconductor devices involving the implantation of tellurium as a submicron N-type layer in the surface of a gallium arsenide substrate comprising the steps of:

a. preparing a cadmium doped P-type gallium arsenide substrate;

b. implanting a 220 KeV ion dose of tellurium into the surface of said P-type gallium arsenide at 350° C with an incident beam at least 10° from any low-index axis;

c. sputtering a coating of aluminum nitride onto said implanted surface and d. heating said coated surface to a temperature of about 900° C for about 10 minutes in flowing hydrogen to effect an anneal of said implanted surface to form a submicron N-type layer therein.

* * * * *